United States Patent [19]

Asawa

[11] 4,214,165
[45] Jul. 22, 1980

[54] PYROELECTRIC IR DETECTOR WITH SIGNAL CAPACITIVELY COUPLED TO AN OUTPUT CIRCUIT

[75] Inventor: Charles K. Asawa, Pacific Palisades, Calif.

[73] Assignee: Hughes Aircraft Company, Culver City, Calif.

[21] Appl. No.: 13,705

[22] Filed: Feb. 21, 1979

[51] Int. Cl.² .............................................. G01J 1/00
[52] U.S. Cl. ................................. 250/338; 250/340; 250/353
[58] Field of Search ............... 250/338, 340, 342, 353, 250/332; 313/388; 357/29, 30

[56] References Cited

U.S. PATENT DOCUMENTS

| 4,032,783 | 6/1977 | Koda | 250/338 |
| 4,044,374 | 8/1977 | Roberts et al. | 357/29 |
| 4,047,070 | 9/1977 | Conklin | 313/388 |
| 4,053,806 | 10/1977 | Turnbull et al. | 313/388 |
| 4,058,729 | 11/1977 | Sher | 250/338 |
| 4,060,729 | 11/1977 | Byer et al. | 250/338 |
| 4,072,863 | 2/1978 | Roundy | 250/332 |

Primary Examiner—Davis L. Willis
Attorney, Agent, or Firm—William J. Bethurum; W. H. MacAllister

[57] ABSTRACT

The specification describes a novel pyroelectric detector in which one input detector electrode is mounted directly on one surface of a pyroelectric substrate and is used for absorbing chopped incoming infrared radiation. The output detector electrodes are capacitively coupled to the reverse substrate surface and provide an AC coupled output signal with a minimum of conductive heat transfer from the pyroelectric substrate.

6 Claims, 6 Drawing Figures

PYROELECTRIC IR DETECTOR WITH SIGNAL CAPACITIVELY COUPLED TO AN OUTPUT CIRCUIT

FIELD OF THE INVENTION

This invention relates generally to infrared radiation detectors for use in IR imaging applications, and more particularly to a pyroelectric IR detector having improved thermal insulation characteristics.

BACKGROUND OF THE INVENTION

Pyroelectric detector devices, such as the pyroelectric vidicon, are generally well known in the field of infrared imaging and have been constructed using a variety of known pyroelectric materials, such as lithium tantalate and lithium niobate, as the basic IR radiation-to-signal voltage conversion medium of the detector. The pyroelectric detector has been used in a wide variety of applications in the field of thermal imaging, and a recent discussion of the pyroelectric vidicon may be found, for example, in an article by A. G. Shepard entitled "Today's Infrared Reading Vidicons Map Clearer Pictures", Electronics, pp. 99-105, Nov. 24, 1977. Other diverse forms of pyroelectric detectors are disclosed respectively by Byer et al in U.S. Pat. No. 4,060,729, by Turnbull et al in U.S. Pat. No. 4,053,806, by Roundy in U.S. Pat. No. 4,072,863, by Sher in U.S. Pat. No. 4,058,729, by Roberts et al in U.S. Pat. No. 4,044,374, and by Conklin in U.S. Pat. No. 4,047,070, and all of the above-identified references are incorporated herein by reference.

In one type of pyroelectric detector construction particularly relevant as prior art to the present invention, a pyroelectric substrate material such as lithium tantalate has a continuous thin metal infrared absorbing layer deposited on one surface thereof to receive thermal radiation from an object or scene within a particular field of view (FOV). The reverse surface of the pyroelectric substrate includes a plurality of metallic readout electrodes which form a particular grid pattern from which an output signal voltage may be derived. This readout grid pattern may be coupled to chosen digital or analog readout circuitry, typically including serial voltage-controlled devices, such as charge-coupled devices (CCD's), whose output may in turn be applied through conventional signal processing circuitry to a video camera or the like. The size, shape and spacing of the readout grid pattern on the pyroelectric substrate will, of course, depend upon the particular application in which the detector is used. One example of this type of pyroelectric detector is disclosed in U.S. Pat. No. 4,032,783, of N. J. Koda, assigned to the present assignee.

In order to prevent unacceptable heat transfer and thermal loss from the pyroelectric material of the detector, which loss in turn causes a reduced detector responsivity, the readout grid electrodes or pattern on the reverse side of the pyroelectric substrate have traditionally been thermally insulated to some degree from their immediate support member or housing. This has been accomplished using various approaches to minimize heat transfer from the pyroelectric material to the support member. One of these prior approaches is to use insulating spacers between electrodes on the reverse surface of the pyroelectric material and an underlying support member, and these readout electrodes are connected to other external signal processing circuitry by means of wires or pins extending through the insulating spacers. Another prior approach is to use insulating pads which have been coated with a thin metal film as a means for connecting the pyroelectric material and the reverse-surface electrode members thereon to an underlying support and readout electrode member. But in both of of these direct (DC) substrate interconnect techniques, there will be some undesirable heat transfer and loss by thermal conduction from the pyroelectric material and through the metal interconnect to the underlying support and readout member.

In practice, this detector support member will frequently provide support and electrical readout for a large number of these pyroelectric detectors positioned in a chosen array, so that the particular thermal isolation techniques used to satisfactorally thermally insulate a large plurality of these pyroelectric substrates can become quite complicated. However, when using either simple or complicated and sophisticated thermal insulation techniques for this purpose, there will nevertheless always be some direct conductive heat losses from the pyroelectric material as a result of the uninterrupted heat transfer path from the pyroelectric susbstrate material and the surface electrode members thereon, and through the metallic interconnect wires or pads to the readout circuitry in or on the adjacent detector support structure. Additionally, an increase in the complexity and sophistication of these detector insulation techniques will normally incrase the complexity and expense of these detectors or detector arrays and degrade their reliability.

SUMMARY OF THE INVENTION

The general purpose of this invention is to provide a new and improved pyroelectric detector having improved thermal isolation of the detector's pyroelectric substrate material and which may be constructed using a simplified method of fabrication.

To accomplish this purpose, I have discovered and reduced to practice a novel pyroelectric detector structural arrangement and combination which includes a pyroelectric substrate having first and second major surfaces and further having a thin continuous infrared absorbing metal electrode member disposed on the first major surface for receiving incoming infrared radiation. A detector support member underlies and is displaced from the second major surface of the pyroelectric substrate material and includes a plurality of discrete electrode members adjacent its surface and facing the second major surface of the pyroelectric substrate. These electrode members are capacitively coupled to the second major surface of the pyroelectric substrate and spaced a chosen distance therefrom by an insulating spacer or spacers which are interposed at chosen locations between the support member and the pyroelectric substrate. This electrode arrangement and spacing minimizes heat transfer from the pyroelectric substrate, and radiation (photon) induced voltage variation which are developed across the pyroelectric substrate are capacitively coupled across the air gap between the second major surface of the substrate and the plurality of discrete grid readout electrode members. The capacitively coupled signal voltages appearing on these later electrodes may then be coupled to additional selected signal processing readout circuitry for subsequent application to a chosen visual display, such as a TV camera.

Accordingly, it is an object of the present invention to provide a new and improved pyroelectric detector for sensing infrared radiation.

Another object of this invention is to provide a pyroelectric detector of the type described which requires a relatively simple fabrication method for its construction and support.

Another object of this invention is to provide a pyroelectric detector of the type described having improved thermal insulation properties and a correspondingly improved responsivity at certain frequencies.

Another object of this invention is to provide a pyroelectric detector of the type described which is readily adaptable for the inclusion into a variety of detector arrays and associated readout electrode configurations.

A feature of this invention is the provision of a pyroelectric detector wherein one surface electrode member thereof is deposited as a thin continuous IR absorbing metal on one surface of a pyroelectric substrate and the other electrode member or members thereof forming a grid pattern for signal readout is spaced from and capacitively coupled to the other or reverse surface of the pyroelectric substrate for minimizing heat conduction and thermal losses therefrom.

Another feature of this invention is the provision of insulating spacer members positioned between the pryoelectric substrate and an adjacent support member and located with respct to the grid pattern in such a manner as to minimize thermal conductivity from the pyroelectric substrate to the support member.

These and other objects and features of this invention will become more readily apparent in the following description of the accompanying drawings.

DESCRIPTION OF THE PREFERRED EMBODIMENTS

Figure 1:
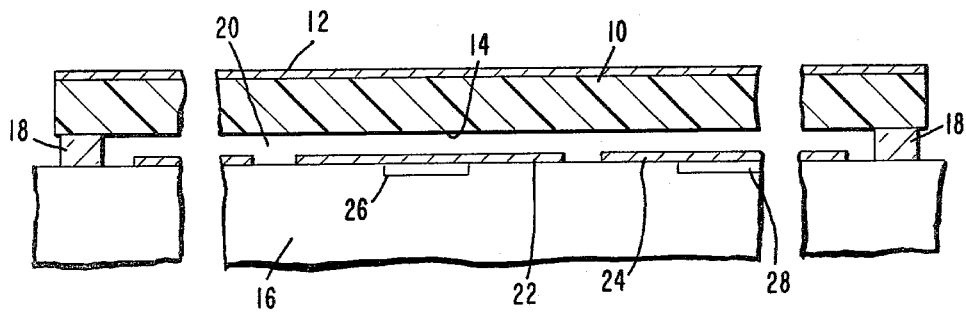
FIG. 1 is a schematic and fragmented cross-section view of the pyroelectric detector according to the invention.

Referring now to FIG. 1, the pyroelectric detector structure shown therein includes a pyroelectric substrate 10, which is typically lithium niobate or lithium tantalate. This pyroelectric material is well known in the art and is commercially available from a number of companies, such as for example Crystal Technology, Inc. of Mountain View, Calif. The substrate 10 is typically 25 micrometers in thickness and 1×1 centimeters in area and has a thin upper metallic electrode layer deposited thereon using conventional metal evaporation or sputtering techniques. The upper metal electrode 12 is used for connecting the pyroelectric detector substrate 10 to an external circuit to be further described, and this electrode member 12 and its underlying pyroelectric material 10 are adapted to receive chopped incoming infrared radiation (IR) originating from an object or scene within a particular field of view (FOV).

As will be described in more detail, one typical prior art detector (not shown) will include a second or backside contact electrode (also not shown) directly on the reverse 24 or lower surface of the pyroelectric substrate 10. This lower or reverse electrode is typically configured in a desired grid or pattern consistent with detector resolution requirements and and readout specifications. However, contrary to this conventional prior art approach and in accordance with the novel discovery of the present invention, there is no direct or DC electrical contact with the lower surface 14 of the pyroelectric substrate 10. Instead, the pyroelectric substrate 10 is electrically insulated from its underlying support and readout structure 16 by means of one or more insulating spacers 18. One insulating material which is well suited for use in forming these spacers 18 is a material with the tradename "PYRE-ML" sold by the DuPont de Nemours Company of Wilmington, Del. However, other suitable insulating materials will work satisfactorily in performing the spacing and support functions provided by the insulating spacers 18.

The lower surface 14 of the pyroelectric substrate 10 is capacitively coupled through the air gap 20 to a plurality of output electrode members 22 and 24, respectively, which form part of the output electrode grid pattern and which are deposited on the upper surface of the support and readout structure 16 using standard metal pattern formation techniques. Advantageously, the supporting substrate 16 may be a silicon wafer in which a plurality of charged-coupled devices (CCDs) (not shown) have been fabricated using standard MOS planar processing technology well-known to those skilled in the art. These CCDs will be interconnected to each other and to other external CCD readout circuitry using standard CCD interconnect techniques (also not shown) for processing the radiation induced signals which are capacitively coupled from the pyroelectric substrate 10 to the plurality of output electrodes 22 and 24. For example, these charge-coupled devices and associated readout circuits may have been previously fabricated in the silicon wafer 16 so as to have a plurality of CCD input electrodes 26 and 28 for making direct electrical connection as shown to particular electrode segments 22, 24 respectively of the readout grid pattern on the upper surface of the readout and support structure 16.

Thus, by DC isolating the pyroelectric substrate material 10 from the underlying support and readout structure 16 by means of the insulating spacers 18, heat transfer and thermal loss from the pyroelectric substrate material 10 is minimized to thereby in turn optimize or maximize the responsivity of the pyroelectric detector arrangement of FIG. 1.

Figure 2A:
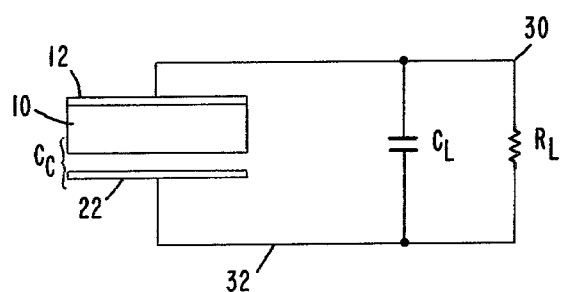
FIG. 2a is an actual equivalent circuit for the pyroelectric detector in FIG. 1.

Referring now to FIG. 2a the pyroelectrical detector of FIG. 1 is shown connected to an external circuit represented by an equivalent load resistor $R_L$ and an equivalent load capacitor $C_L$. The connection of the pyroelectric detector arrangement to this external circuit is made by one lead 30 which is connected as shown to the upper electrode layer 12 of the detector and by a lower lead 32 which is connected to the plurality of lower electrodes e.g. 22, 24, in a readout grid pattern of lower electrode members as previously indicated.

Figure 2B:
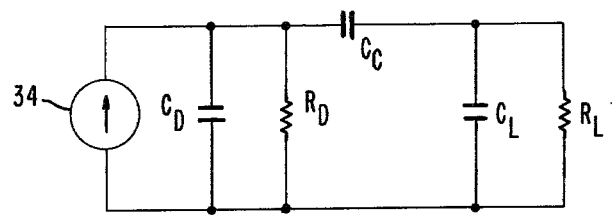
FIG. 2b is an electrical equivalent circuit for the pyroelectric detector in FIG. 1.

Referring now to FIG. 2b, there is shown a complete electrical equivalent circuit of FIG. 2a wherein the pyroelectric detector is represented by an equivalent current source 34 which is connected as shown in series with an equivalent detector output coupling capacitance $C_D$ and in parallel with a detector resistance $R_D$ which represents the series resistance through the pyroelectric material 10 from one major surface thereof to the other. The parameter $C_D$ is the capacitance across major surfaces of the detector material 10. However, in contrast to those pyroelectric detectors of the prior art having both output electrodes or electrode patterns disposed directly on both major surfaces of the pyroelectric material, the detector arrangement according to the present arrangement features the added parameter of the detector coupling capacitance $C_C$ which is the capacitance between the lower surface 14 of the pyroelectric substrate 10 and the readout electrodes 22 and 24, previously described. This capacitance $C_C$ provides output signal coupling to the external load $R_L$ and $C_L$.

The coupling capacitor $C_C$ provides an undesirable, but tolerable loss in voltage in the series circuit portion of FIG. 2b, and from that standpoint, this coupling capacitance $C_C$ detracts from the performance of my novel detector arrangement. On the other hand, this unwanted loss of voltage can be corrected and compensated for by the use of appropriate amplification (not shown) in the external readout circuitry for the detector. Thus, this novel approach represents a very acceptable fabrication tradeoff when considering the substantial improvement one achieves in: (1) reduction in thermal losses from the pyroelectric material 10, (2) the improved responsivity realized by using the capacitively coupled output electrode arrangement shown in FIG. 1, and (3) the ease of fabrication involved.

The low thermal loss from the pyroelectric substrate material 10 provided by the present invention results in a high responsivity (measured in volts per watt of unit area of pyroelectric substrate surface) for frequencies between the reciprocals of the thermal time constant of the detector and the two time constants $C_D \cdot R_D$ and $C_C \cdot R_D$ identified in FIG. 2b. However, the maximum responsivity of the detector occurs for radiation frequencies of the order of 1 Hertz or less.

Analysis of this pyroelectric detector configuration in FIGS. 1, 2a and 2b was made to assess the degradation in high frequency (greater than 1 Hertz) responses due to the capacitive coupling through $C_C$. Pyroelectric operation at higher frequencies occurs along a 10 db responsivity drop per 10 db-watt curve defined by the equation below. A reduction in the above time constants does not result in any higher responsivity for a given high frequency than along the high frequency responsivity curve defined by this equation. This responsivity curve is obtained by combining the electrical equivalent circuit of FIGS. 2a and 2b above with known thermal and pyroelectric equations, such as are defined, for example, by E. H. Putley, *Semiconductor and Semimetals*, Vol. 5, p. 259 (Willardson and Beers, Editors) N.Y., 1972.

The amplitude of the high frequency responsivity, $r_v$, in volts per watt input, corresponding to IR modulating or chopping radian frequency $\omega$, when $\omega$ is larger than the reciprocal of the above time constants, is given by:

$$r_v = (\eta \cdot p)/\omega \cdot c_v b \; [(C_D + C_L) + (C_D C_L / C_C)] \qquad (1)$$

where $\eta$ = thermal radiation absorption efficiency
$b$ = thickness of the pyroelectric wafer
$p$ = pyroelectric coefficient
$c_v$ = volume specific heat of pyroelectric wafer
$C_D$ = capacitance of pyroelectric detector
$C_L$ = load (amplifier input) capacitance
$C_C$ = capacitance between bottom of pryoelectric wafer and adjacent surface of lower detector electrode.

Figure 3A:
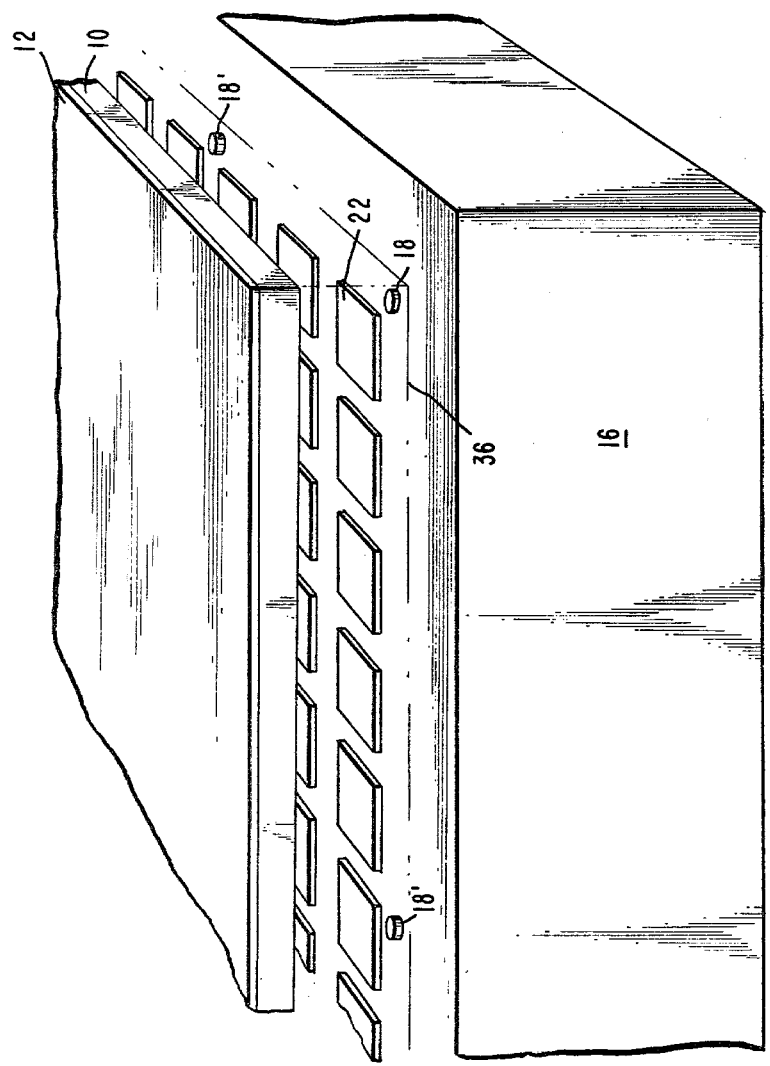
FIG. 3a is fragmented isometric view illustrating the pyroelectric detector arrangement according to the invention, including a large plurality of readout electrodes on an underlying detector-support member.

The high frequency responsivity for a conventional prior art detector configuration where both detector electrodes are disposed on the opposing surfaces of the pyroelectric wafer is obtained from equation (1) above by letting $C_C$ approach infinity. Then the last term in brackets in the denominator is zero, so that $r_v$ increases. The degradation of the responsivity brought about by detaching the lower detector electrode so that $C_C$ is a finite value, in accordance with the present invention, will depend upon the ratio of load (amplifier) capacitance, $C_L$, and the coupling capacitance, $C_C$. By selecting an appropriately low value of $C_L$, and small separation between the pyroelectric wafer and the lower detector electrode, the last term in the brackets in the denominator of equation (1) can be made small, so that the value of the responsivity $r_v$ is not greatly degraded by the capacitance coupling of $C_C$. Referring now to FIG. 3a, the pyroelectric detector according to the invention is shown in a partially fragmented isometric view wherein a single pyroelectric substrate material 10 and a single overlying upper electrode metal layer 12 are used in combination with a large plurality of readout electrodes 22 which are configured and positioned in the pattern shown directly on the upper surface of a supporting silicon substrate 16. A plurality of spacers 18, 18' are positioned around the peripheral boundary 36 of the upper surface of the silicon substrate 16 which, as previously indicated, may have been previously processed using known Metal-Oxide-Semiconductor (MOS) planar technology to include a conventional charge-coupled device (CCD) signal processing and readout circuitry. This circuitry, which is not shown or described in any detail, may in turn be connected to a suitable display, such as a TV camera, for viewing a scene or target within a particular field of view.

Figure 3B:
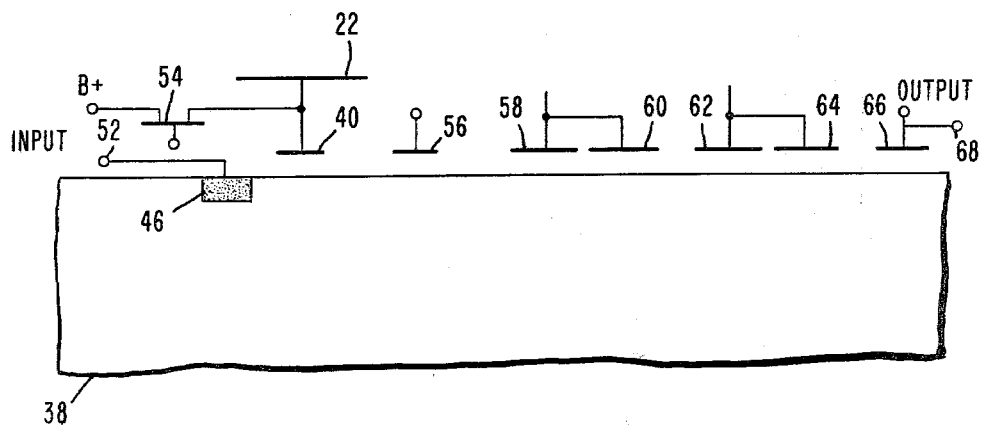
FIG. 3b is a partial readout circuit schematic representative of the type of output CCD electrode coupling which may be used for the detector arrangements in FIGS. 3a and 3b.
Figure 3C:
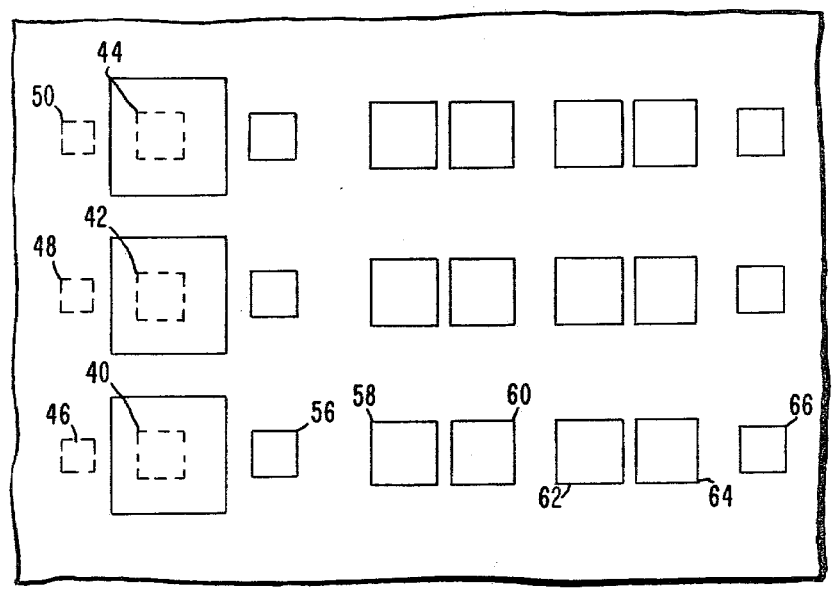
FIG. 3c is a plan view showing the CCD electrode spacing in FIG. 3b.

Referring now to FIG. 3b, there is shown a typical output electrode connection between the spaced readout electrodes 22 and a charge coupled output device (CCD) structure 38. This CCD structure 38 may be incorporated into or fabricated on the substrate 16 in FIG. 3a using state-of-the-art CCD and MOS planar processes which form no part of this invention. However, one typical interelectrode connection between the pyroelectric detector output electrodes and the CCD output provides for each row of readout electrodes 22 to be connected, as shown in FIGS. 3b and 3c, to a plurality of control gates 40, 42 and 44. Each control gate 40, 42, and 44 is capacitively coupled to an adjacent charge injection or input region 46, 48 and 50, respectively, which are formed by selective diffusion or ion implantation doping and are further connected to receive input charge-inducing signals from a plurality of input terminals, e.g., 52.

Each control gate 40 is appropriately biased via a high impedance junction field-effect transistor 54 to a source of bias supply $B^+$, and charge from the input charge injection region 46 is transferred from left-to-right in FIG. 3b by the voltage on the control gate 40 and also by the voltage on an adjacent charge transfer gate 56 to a plurality of clock electrode pairs 58, 60 and 62, 64. The charge flowing laterally in the semiconductor substrate 38 and from left-to-right beneath the charge transfer and clocking electrodes 56, 58, 60, 62 and 64 is ultimately sensed by an output electrode 66, which is connected by way of an output conductor 68 to a chosen utilization circuit or display (not shown).

The brief illustrations in FIGS. 3a, 3b and 3c are only intended to show one general type of suitable electrical interconnection between the pyroelectric detector output electrodes 22 and the CCD gate or control electrodes. These figures are not intended to provide a detailed description of CCD device and readout circuit operation. This operation, and a wide variety of suitable CCD readout circuits and arrays suitable for this purpose, are well documented in the art and are described in some detail by Carlo H. Sequin and Michael F. Thompsett in *Charge Transfer Devices,* Academic Press, Inc., New York, 1975, and by D. F. Barbe in an article entitled, "Imaging Devices Using the Charge-Coupled Concept", *Proceeding of the IEEE,* Vol. 63, No. 1, January 1975. Both of these references and the references cited therein are incorporated herein by reference.

Therefore, it should be understood that the pyroelectric detector arrangement according to the present invention is not limited in any way by a particular type of output connection to suitable known readout circuitry, and may be employed and practiced in connection with various suitable types of readout circuits, CCD or otherwise, which are adaptable for capacitively coupling via a grid or electrode pattern 22 to a pyroelectric detector material 10.

What is claimed is:

1. A pyroelectric detector including, in combination:
   (a) a pyroelectric substrate having first and second major surfaces, with said first and second major surfaces adapted to receive chopped incoming infrared radiation;
   (b) a continuous infrared absorbing metal electrode member disposed on said first major surface for receiving chopped incoming infrared radiation and conducting same to said pyroelectric substrate for developing voltages thereacross in response and proportional to photon energy received; and
   (c) means including a plurality of discrete metallic electrode members displaced from and capacitively coupled to said second major surface of said pyroelectric substrate for supporting said pyroelectric substrate and minimizing heat transfer from said substrate, whereby pyroelectric voltages developed across said substrate are capacitively coupled to and readout from said discrete electrode members.

2. The pyroelectric detector defined in claim 1 wherein said pyroelectric substrate is selected from the group of pyroelectric materials consisting of lithium tantalate and lithium niobate, said continuous IR absorbing metal film is nichrome, and said means supporting said pyroelectric substrate includes insulating spacers positioned between said pyroelectric substrate and a surface of said supporting means in or on which said plurality of readout electrode members are located, said spacers displacing said readout electrode members from said second major surface of said pyroelectric substrate from bewteen one or two micrometers.

3. The pyroelectric detector defined in claim 1 wherein said supporting means includes a silicon substrate having said plurality of readout electrodes disposed in or adjacent one surface thereof and having a corresponding plurality of charge-coupled devices at predetermined locations within said silicon substrate and spaced and positioned at predetermined locations with respect to said plurality of readout electrodes, whereby signal voltages on said readout electrodes control the flow of charge carriers in said silicon substrate and the conductivity of said plurality of charge-coupled devices to thereby control the output signals from said charge-coupled devices which may then be applied to selected display circuitry.

4. The detector defined in claim 3 wherein said pyroelectric substrate is selected from the group of pyroelectric materials consisting of lithium tantalate and lithium niobate, said continuous IR absorbing metal film is nichrome, and said means supporting said pyroelectric substrate includes spacers positioned between said pyroelectric substrate and said silicon substrate surface in or on which said plurality of readout electrode members are located, said spacers displacing said readout electrode members from said second major surface of said pyroelectric substrate from between one to two micrometers, said readout electrodes are either evaporated on said silicon substrate or are P or N type diffusions into said silicon substrate.

5. A method for producing an electrical output signal which is proportional to variations in received chopped electromagnetic radiation, which method comprises:
   (a) exposing a pyroelectric substrate material to incoming electromagnetic radiation and generating in response thereto a signal voltage across said substrate material, and thereafter;
   (b) capacitively coupling said signal voltage from said pyroelectric substrate material to a plurality of output electrodes and applying the capacitively coupled signal voltage to an output utilization circuit for monitoring the source from which said electromagnetic radiation is received, whereby thermal losses from said substrate material are minimized.

6. A method for converting chopped electromagnetic radiation to an electrical signal which includes pyroelectrically sensing said radiation to develop a signal voltage in response thereto, and capacitively coupling said signal voltage to a remote location, whereby heat losses in the sensing and coupling processes are minimized.

* * * * *